US010181699B2

(12) United States Patent
Adachi et al.

(10) Patent No.: US 10,181,699 B2
(45) Date of Patent: Jan. 15, 2019

(54) SEMICONDUCTOR OPTICAL DEVICE, OPTICAL MODULE, AND METHOD FOR MANUFACTURING SEMICONDUCTOR OPTICAL DEVICE

(71) Applicant: Oclaro Japan, Inc., Kanagawa (JP)

(72) Inventors: Koichiro Adachi, Tokyo (JP); Kouji Nakahara, Tokyo (JP); Akira Nakanishi, Tokyo (JP)

(73) Assignee: Oclaro Japan, Inc., Kanagawa (JP)

( * ) Notice: Subject to any disclaimer, the term of this patent is extended or adjusted under 35 U.S.C. 154(b) by 0 days.

(21) Appl. No.: 15/671,540

(22) Filed: Aug. 8, 2017

(65) Prior Publication Data
US 2018/0048116 A1 Feb. 15, 2018

(30) Foreign Application Priority Data

Aug. 10, 2016 (JP) ................... 2016-157858

(51) Int. Cl.
*H01S 5/022* (2006.01)
*H01S 5/0625* (2006.01)
(Continued)

(52) U.S. Cl.
CPC ........ *H01S 5/06251* (2013.01); *H01S 5/0261* (2013.01); *H01S 5/0267* (2013.01);
(Continued)

(58) Field of Classification Search
CPC .......... H01S 5/0265; H01S 5/164; H01S 5/18; H01S 5/2202
See application file for complete search history.

(56) References Cited

U.S. PATENT DOCUMENTS 6,639,241 B2 * 10/2003 Nakahara .................. H01S 5/22
  257/101
8,526,477 B2 * 9/2013 Saito ...................... B82Y 20/00
  372/43.01
(Continued)

FOREIGN PATENT DOCUMENTS

JP    H09-129964    5/1997
JP    2008-205499   9/2008
(Continued)

OTHER PUBLICATIONS

S. Hirata, et al, "λ4-Shifted AlGaAs/GaAs DFB Lasers With Double Window Structures", IEEE Electronics Letters, vol. 23, No. 12, Jun. 4, 1987, pp. 627 and 628.

*Primary Examiner* — Michael Carter
(74) *Attorney, Agent, or Firm* — Mattingly & Malur, PC

(57) ABSTRACT

A semiconductor optical device includes: a first conductive type semiconductor layer; an active layer; a second conductive type semiconductor layer including a ridge portion; a pair of first grooves, formed on bottom surfaces of both sides of the ridge portion and dividing the active layer; an optical functioning part including the first and second conductive type semiconductor layers, converting a state of light, and having a height higher than a height of the bottom surface of the ridge portion; and a second groove, at least a part thereof being formed on the optical functioning part, an end portion thereof being connected to the first groove, the second conductive type semiconductor layer being divided, and the maximum height of an inner wall surface thereof being higher than the maximum height of an inner wall surface of the first groove.

12 Claims, 19 Drawing Sheets

(51) Int. Cl.
*H01S 5/026* (2006.01)
*H01S 5/24* (2006.01)
*H01S 5/18* (2006.01)
H01S 5/12 (2006.01)
H01S 5/22 (2006.01)
H01S 5/42 (2006.01)

(52) U.S. Cl.
CPC ...... *H01S 5/02236* (2013.01); *H01S 5/02288* (2013.01); *H01S 5/02292* (2013.01); *H01S 5/18* (2013.01); *H01S 5/24* (2013.01); H01S 5/0265 (2013.01); H01S 5/02248 (2013.01); H01S 5/02284 (2013.01); H01S 5/12 (2013.01); H01S 5/22 (2013.01); H01S 5/42 (2013.01)

(56) References Cited

U.S. PATENT DOCUMENTS

| | | | |
|---|---|---|---|
| 2002/0060840 A1* | 5/2002 | Tatoh | G02B 6/4201 359/341.1 |
| 2009/0078944 A1* | 3/2009 | Kubota | B82Y 20/00 257/88 |
| 2012/0230361 A1 | 9/2012 | Adachi et al. | |
| 2014/0328363 A1* | 11/2014 | Kwon | H01S 5/22 372/45.01 |

FOREIGN PATENT DOCUMENTS

| | | |
|---|---|---|
| JP | 2014-035540 | 2/2014 |
| WO | 2011/065517 | 6/2011 |

* cited by examiner

SEMICONDUCTOR OPTICAL DEVICE, OPTICAL MODULE, AND METHOD FOR MANUFACTURING SEMICONDUCTOR OPTICAL DEVICE

CROSS-REFERENCE TO RELATED APPLICATION

The present application claims priority from Japanese application JP 2016-157858, filed on Aug. 10, 2016, the content of which is hereby incorporated by reference into this application.

BACKGROUND OF THE INVENTION

1. Field of the Invention

The present invention relates to a semiconductor optical device, an optical module, and a method for manufacturing a semiconductor optical device.

2. Description of the Related Art

A semiconductor optical device into which a laser part and an optical functioning part for converting a state of laser light including a mirror and the like are integrated is known. The semiconductor optical device may include grooves for reducing parasitic capacitance by narrowing an energization range.

In JP WO2011/065517 A1, a horizontal resonator surface emission laser including a reflection part that changes a light path of laser light is described.

In JP 2014-035540 A, an optical integrated circuit including a first mesa-type optical waveguide and a second mesa-type optical waveguide of which cross-sections intersecting a light guiding direction are mutually different, is described.

In JP 2008-205499 A, a semiconductor optical device having at least a region for blocking conductivity in a direction along a layer surface of a semiconductor layer, is described.

In JP H09-129964 A, an optical semiconductor device having a pair of grooves into which a semiconductor laser and a mode conversion waveguide are integrated, and an interval in a region of the mode conversion waveguide is wider than a region of the semiconductor laser, is described.

In S. Hirata, et al, "λ/4-SHIFTED AlGaAs/GaAs DFB LASERS WITH DOUBLE WINDOW STRUCTURES", IEEE ELECTRONICS LETTERS, vol. 23, No. 12, Jun. 4, 1987, pp. 627 and 628, a λ/4 shift DFB laser in which a window structure is integrated into a light emitting end, is described.

SUMMARY OF THE INVENTION

For example, as described in JP 2008-205499 A, in the semiconductor optical device, an active layer may be divided by providing a pair of grooves in a semiconductor optical device so as to sandwich a ridge portion formed in a stripe shape. This makes the energization range passing through the active layer narrow. However, since an energization path passing through the optical functioning part is present in the semiconductor optical device into which the laser part and the optical functioning part are integrated, the energization range may not be sufficiently narrowed and parasitic capacitance may not be sufficiently reduced by merely providing the groove dividing the active layer.

In the semiconductor optical device disclosed in JP H09-129964 A, grooves are integrally formed on a laser region and a waveguide region having a layer of the same height. Here, a configuration disclosed in JP H09-129964 A is applied in a semiconductor optical device into which a laser part including a ridge portion and an optical functioning part are integrated, is considered. However, it is necessary to form the height of the optical functioning part at the same height as the bottom surface of the ridge portion so as to apply the configuration. If such a configuration is adopted, the height of the optical functioning part becomes insufficient. Accordingly, there is a possibility that a function of converting a state of laser light by the optical functioning part is not sufficiently exhibited.

An object of the invention is to provide a semiconductor optical device, an optical module, and a method for manufacturing a semiconductor optical device in which the state conversion of the laser light is reliably performed by the optical functioning part and the parasitic capacitance is reduced.

(1) In order to solve the problems, the semiconductor optical device according to the invention includes: a first conductive type semiconductor layer; an active layer that is provided on at least a part of the first conductive type semiconductor layer, and includes a light emitting layer; a second conductive type semiconductor layer that includes a ridge portion provided on the first conductive type semiconductor layer and on the active layer, and formed in a stripe shape; a pair of first grooves that is formed on a bottom surface of both sides of the ridge portion and divides the active layer; an optical functioning part that includes at least the first conductive type semiconductor layer and the second conductive type semiconductor layer, converts a state of light emitted from the light emitting layer, and has a height higher than a height of the bottom surface of the ridge portion; and a second groove in which at least a part thereof is formed on the optical functioning part, an end portion thereof is connected to the first groove, the second conductive type semiconductor layer is divided, and the maximum height of an inner wall surface thereof is higher than the maximum height of an inner wall surface of the first groove.

(2) In the semiconductor optical device according to (1), the second groove is connected to the first groove in a state of being separated from an end portion of an optical functioning part side of the first groove.

(3) In the semiconductor optical device according to (2), the second groove includes a parallel part that extends in the same direction as an extending direction of the first groove, and a connection part that extends in a direction different from the extending direction of the first groove, and the connection part is connected to the first groove in a state of being separated from the end portion of the optical functioning part side of the first groove.

(4) In the semiconductor optical device according to (1), the second groove is connected to the first groove so as to overlap a part of an end portion of the second groove with the end portion of the optical functioning part side of the first groove.

(5) In the semiconductor optical device according to any one of (1) to (4), a width of the second groove is wider than a width of the first groove.

(6) In the semiconductor optical device according to any one of (1) to (5), the optical functioning part includes a mirror that converts an advancing direction of light emitted from the light emitting layer, and the second groove is formed to penetrate the mirror.

(7) In the semiconductor optical device according to any one of (1) to (5), the optical functioning part includes a mirror that converts an advancing direction of light emitted from the light emitting layer, and the second groove is formed to surround the mirror in a plan view.

(8) In the semiconductor optical device according to any one of (1) to (5), the optical functioning part includes an optical modulator that modulates amplitude of the light emitted from the light emitting layer by a light absorption layer formed on the first conductive type semiconductor layer, and the first groove is formed to divide the active layer and the light absorption layer.

(9) In the semiconductor optical device according to any one of (1) to (5), the optical functioning part includes a window portion, and the second groove is formed to reach an end surface of the window portion by penetrating the window portion.

(10) In the semiconductor optical device according to (9), the optical functioning part further includes an optical modulator that is provided between the window portion and the light emitting layer and modulates amplitude of the light emitted from the light emitting layer.

(11) An optical module includes the semiconductor optical device according to any one of (1) to (10), a housing that encloses the semiconductor optical device, and a transmission path that is provided in the housing, and transmits light emitted from the semiconductor optical device to the outside of the housing.

(12) The optical module according to (11) further includes a drive circuit that drives the semiconductor optical device, and a circuit board on which the semiconductor optical device and the drive circuit are fixed.

(13) In order to solve the problems, a method for manufacturing a semiconductor optical device according to the invention includes: forming a first conductive type semiconductor layer; forming an active layer including a light emitting layer on at least a part of the first conductive type semiconductor layer; forming a second conductive type semiconductor layer including a ridge portion formed in a stripe shape on the first conductive type semiconductor layer and on the active layer; forming a pair of first grooves dividing the active layer on bottom surfaces of both sides of the ridge portion; forming an optical functioning part which includes at least the first conductive type semiconductor layer and the second conductive type semiconductor layer, converts a state of light emitted from the light emitting layer, and has a height higher than a height of the bottom surface of the ridge portion; and forming a second groove in which an end portion thereof is connected to the first groove, the first groove and the second conductive type semiconductor layer are divided, and the maximum height of an inner wall surface thereof is higher than the maximum height of an inner wall surface of the first groove, so as to form at least a part thereof on the optical functioning part from a second conductive type semiconductor layer side.

According to the invention, there are provided a semiconductor optical device, an optical module, and a method for manufacturing a semiconductor optical device in which the state conversion of the laser light is reliably performed by the optical functioning part and the parasitic capacitance is reduced.

DETAILED DESCRIPTION OF THE INVENTION

Figure 1:
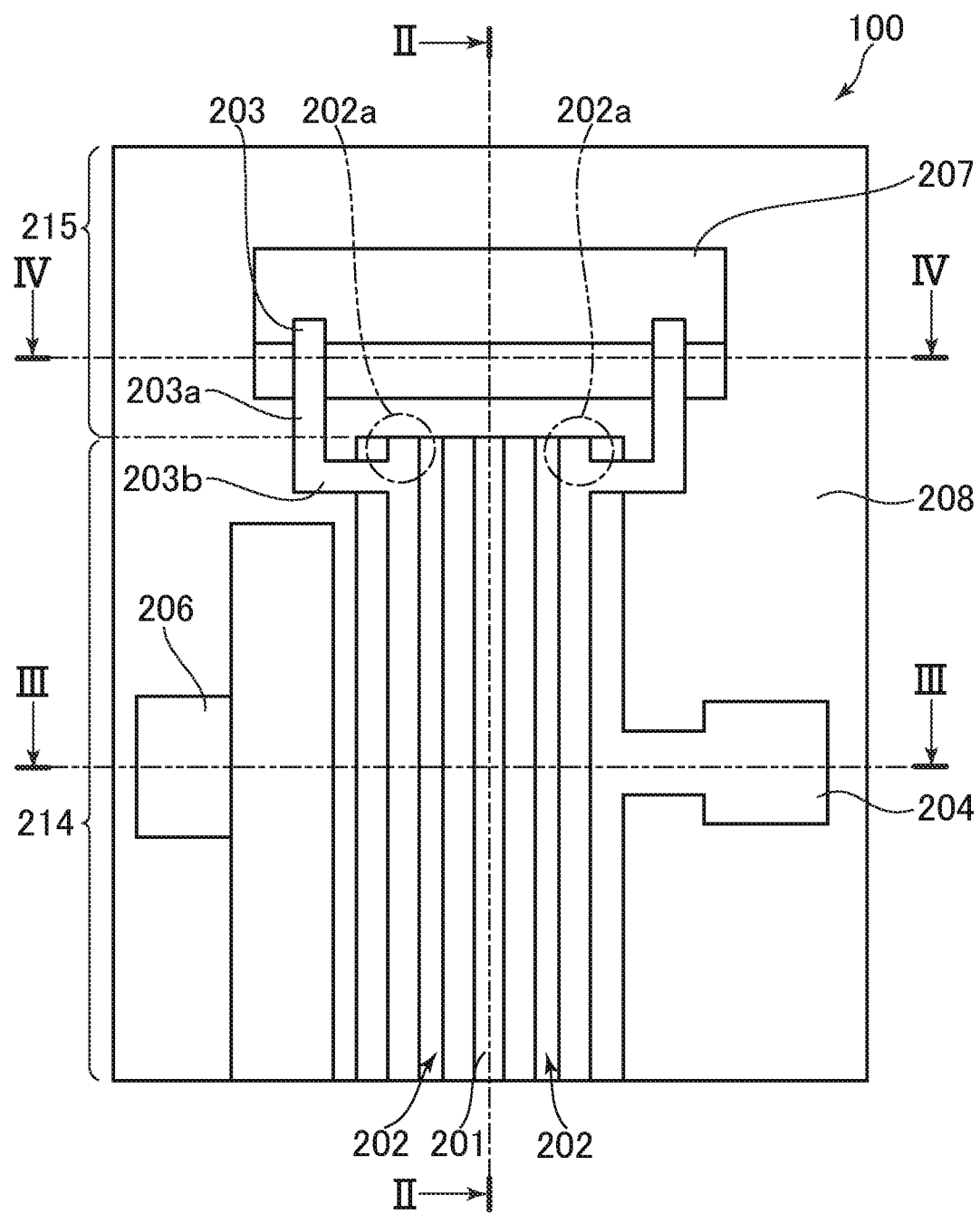
FIG. 1 is a top view of a semiconductor optical device according to a first embodiment of the invention.

Hereinafter, embodiments of the invention will be specifically described in detail with reference to the drawings. In all the drawings for explaining the embodiments, the same reference numerals are given to the members having the same function, and the repetitive description thereof will be omitted. It should be noted that the diagrams illustrated below merely illustrate examples of the embodiments, and the sizes of the diagrams and the scales described in the embodiment do not necessarily coincide.

[First Embodiment]

Figure 2:
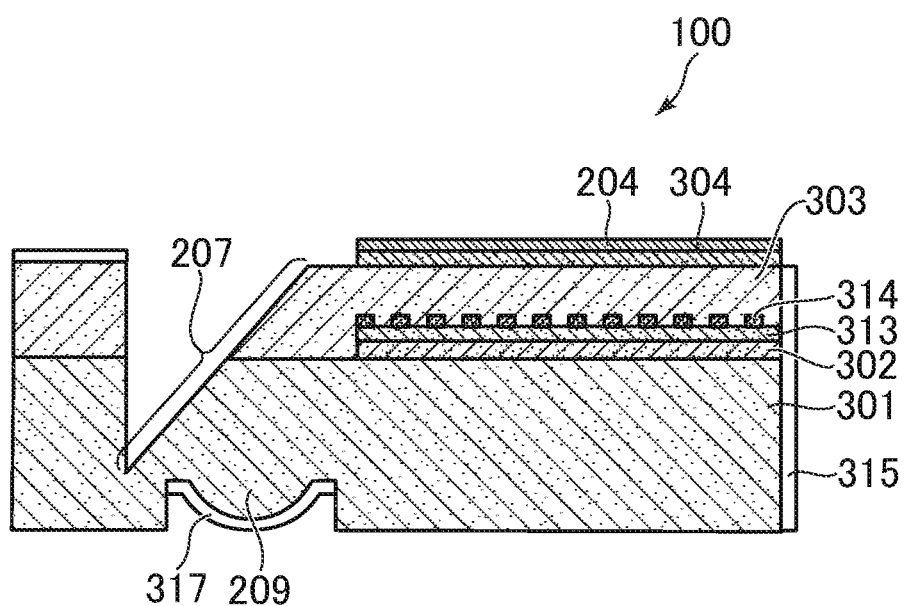
FIG. 2 is a sectional view of the semiconductor optical device according to the first embodiment of the invention.
Figure 3:
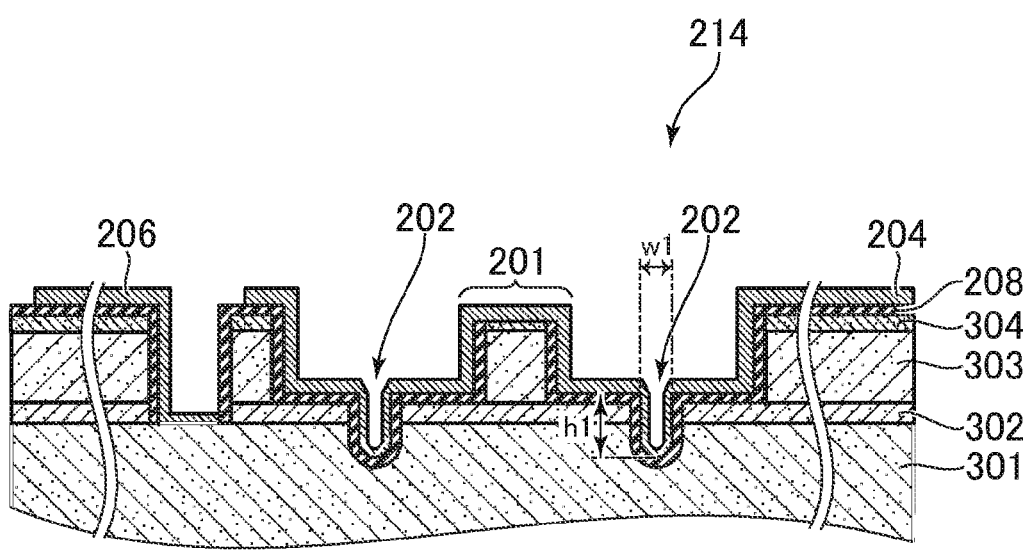
FIG. 3 is a sectional view of the semiconductor optical device according to the first embodiment of the invention.
Figure 4:
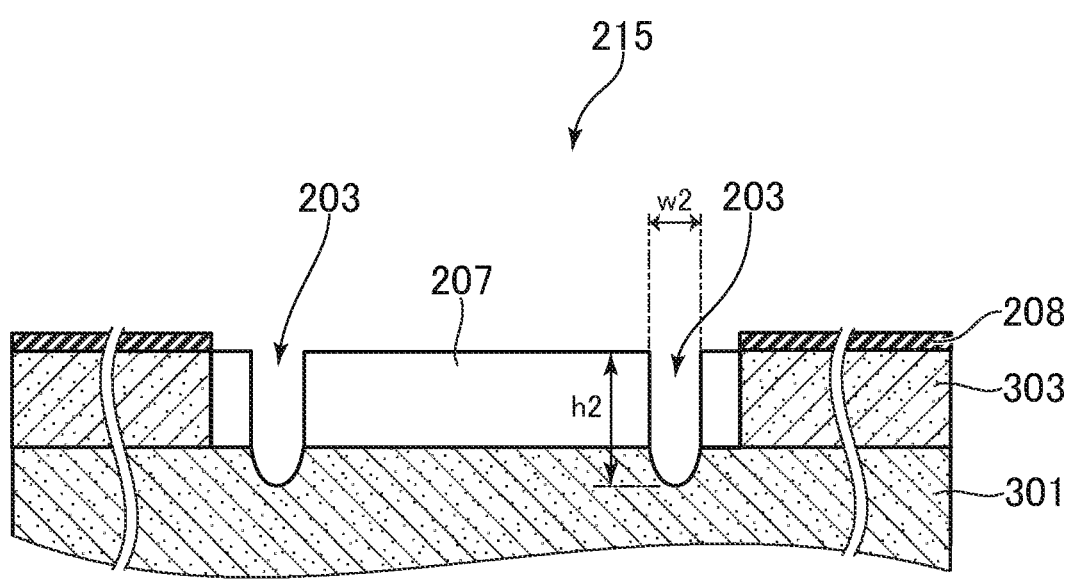
FIG. 4 is a sectional view of the semiconductor optical device according to the first embodiment of the invention.

FIG. 1 is a top view of a semiconductor optical device 100 according to a first embodiment of the invention. In addition, FIG. 2, FIG. 3, and FIG. 4 are sectional views of the semiconductor optical device 100 according to the first embodiment of the invention. FIG. 2 is a diagram illustrating a cross-section taken along the line II-II in FIG. 1, FIG. 3 is a diagram illustrating a cross-section taken along the line in FIG. 1, and FIG. 4 is a diagram illustrating a cross-section taken along the line IV-IV in FIG. 1.

The semiconductor optical device 100 according to the embodiment includes a laser part 214 and an optical functioning part 215. The laser part 214 emits laser light, and the optical functioning part 215 converts a state of laser light emitted from the laser part 214. The semiconductor optical device 100 includes: an n-type semiconductor layer 301 that is a first conductive type semiconductor layer; an active layer 302, which is provided on at least a part of the first conductive type semiconductor layer (n-type semiconductor layer 301), and includes the light emitting layer; and a p-type semiconductor layer 303 that is a second conductive type semiconductor layer, which is provided on the first conductive type semiconductor layer (n-type semiconductor layer 301) and the active layer 302, and includes a ridge portion 201 formed in a stripe shape.

The n-type semiconductor layer 301 is an InP board, the active layer 302 is a semiconductor multi quantum well in which a plurality of InGaAlAs semiconductor layers are laminated, and the p-type semiconductor layer 303 is a p-type InP layer. The laser part 214 is a distributed feedback (DFB) laser, which includes: the active layer 302; a p-type spacer layer 313 provided on the active layer 302; a p-type diffraction grating layer 314 provided on the p-type spacer layer 313; and a high reflection film 315 provided on a rear end surface. The n-type semiconductor layer 301 may be an n-type InP layer provided on a semi-insulating board. In addition, the active layer 302 may include a diffraction grating layer or an SCH layer.

As illustrated in FIG. 3, the ridge portion 201 is formed by a p-type contact layer 304 and the p-type semiconductor layer 303, and a p-type electrode 204 and the p-type contact layer 304 are electrically connected to each other at the top of the ridge portion 201. On a region other than the top of the ridge portion 201, the active layer 302, the p-type semiconductor layer 303, and the p-type contact layer 304 are electrically insulated from the p-type electrode 204 by a protective film 208 formed of an insulation material. In addition, on a part of an upper surface of the semiconductor optical device 100, the n-type semiconductor layer 301 is exposed, the n-type semiconductor layer 301 and an n-type electrode 206 are electrically connected to each other. On a region other than a region on which the n-type semiconductor layer 301 exposed, the active layer 302, the p-type semiconductor layer 303, the p-type contact layer 304, and the n-type semiconductor layer 301 are electrically insulated from the n-type electrode 206 by the protective film 208 formed of the insulation material. In the embodiment, the protective film 208 is formed of $SiO_2$.

The semiconductor optical device 100 includes an optical functioning part 215, which includes at least the first conductive type semiconductor layer (n-type semiconductor layer 301) and the second conductive type semiconductor layer (p-type semiconductor layer 303), converts a state of light emitted from the light emitting layer of the active layer 302 and has a height higher than a bottom surface of the ridge portion 201. In the semiconductor optical device 100 according to the embodiment, the optical functioning part 215 includes: a mirror 207 that converts an advancing direction of the light emitted from the light emitting layer of the active layer 302; and an integrated lens 209 that focuses light. That is, the semiconductor optical device 100 according to the embodiment is a lens-integrated surface-emitting distributed feedback laser (LISEL). The mirror 207 is formed by an inclined end surface of the p-type semiconductor layer 303 and the n-type semiconductor layer 301, and reflects the laser light emitted from the active layer 302 to an integrated lens 209 side. The mirror 207 according to the embodiment is provided to incline a normal direction thereof by 45° with respect to an emission direction of the laser light. The slope of the mirror 207 may be other than 45°. The integrated lens 209 is a lens in which an anti-reflection film 317 is formed on a surface thereof and which is integrated into the n-type semiconductor layer 301 and focuses the laser light. The integrated lens 209 may convert the light reflected from the mirror 207 into parallel light.

The semiconductor optical device 100 includes a pair of first grooves 202 formed on bottom surfaces of both sides of the ridge portion 201 to divide the active layer 302. In the semiconductor optical device 100 according to the embodiment, the p-type semiconductor layer 303 is not formed on the both sides of the ridge portion 201, and the bottom surfaces of the both sides of the ridge portion 201 are a surface of the active layer 302. The first groove 202 is formed to penetrate the active layer 302 and reach the n-type semiconductor layer 301. Since the semiconductor optical device 100 includes the first groove 202 such that an energization region of the active layer 302 is narrowed to a stripe shape region immediately under the ridge portion 201, parasitic capacitance is reduced.

The height (height of protective film 208 formed on inner wall of first groove 202) of an inner wall surface of the first groove 202 according to the embodiment is h1, and the width (gap of protective film 208 formed on inner wall of first groove 202) thereof is w1. The height h1 of the inner wall surface of the first groove 202 is greater than the thickness of the active layer 302.

The semiconductor optical device 100 includes a second groove 203 in which at least a part thereof is formed on the optical functioning part 215, an end portion thereof is connected to the first groove 202, the second conductive type semiconductor layer (p-type semiconductor layer 303) is divided, and the maximum height of an inner wall surface thereof is higher than that of the inner wall surface of the first groove 202. As illustrated in FIG. 4, the second groove 203 is formed to reach from the top of the optical functioning part 215 to the n-type semiconductor layer 301, and divides the p-type semiconductor layer 303. The maximum height of the inner wall surface of the second groove 203 according to the embodiment is h2, and the width thereof is w2. The maximum height h2 of the inner wall surface of the second groove 203 is higher than the maximum height h1 of the inner wall surface of the first groove 202. In the semiconductor optical device 100 according to the embodiment, this is because the height of the optical functioning part 215 is higher than the height of the bottom surface of the ridge portion 201. In addition, the maximum height h2 of the inner wall surface of the second groove 203 is greater than the thickness of the p-type semiconductor layer 303.

According to the semiconductor optical device 100 according to the embodiment, by implementing the height of the optical functioning part 215 as high as the height of the ridge portion 201, state conversion of the laser light is reliably performed by the optical functioning part 215. In addition, the p-type semiconductor layer 303 is divided by the second groove 203 such that the parasitic capacitance of the semiconductor optical device 100 is greatly reduced. Specifically, while the parasitic capacitance when the first groove 202 and the second groove 203 are not provided is approximately 100 pF, the parasitic capacitance of the semiconductor optical device 100 according to the embodiment in which the first groove 202 and the second groove 203 are provided is approximately 1 pF such that an effect of improving the parasitic capacitance by approximately 1/100 can be obtained.

As illustrated in FIG. 1, the second groove 203 is connected to the first groove 202 in a state of being separated from an end portion 202a of an optical functioning part side of the first groove 202. The second groove 203 is formed over the laser part 214 from the optical functioning part 215, and connected to the first groove 202 at a position not overlapping with the end portion 202a of the optical functioning part side of the first groove 202. In the semiconductor optical device 100 according to the embodiment, the end portion 202a of the optical functioning part side of the first groove 202 is formed to protrude by approximately 5 μm to an optical functioning part 215 side. By such a configuration, even if a misalignment in the second groove 203 occurs in a process of forming the second groove 203, the second groove 203 and the first groove 202 are continuously formed, the p-type semiconductor layer 303 can be more reliably divided. In addition, a possibility that the laser light emitted from an end surface of the active layer 302 interferes with the second groove 203, is reduced.

The second groove 203 includes: a parallel part 203a extending in the same direction as an extending direction of the first groove 202; and a connection part 203b extending in a direction different from the extending direction of the first groove 202. The connection part 203b is connected to the first groove 202 in a state of being separated from the end portion 202a of the optical functioning part side of the first groove 202. Here, the extending direction of the first groove 202 may be an extending direction of the ridge portion 201. The second groove 203 according to the embodiment includes a pair of parallel parts 203a and a pair of the connection parts 203b, the parallel part 203a is formed over the laser part 214 from the optical functioning part 215, and the connection part 203b is formed on the laser part 214. An interval between the pair of the parallel parts 203a is formed wider than that between a pair of first grooves 202. The connection part 203b is formed in a direction orthogonal to the extending direction of the first groove 202, and the second groove 203 is connected to the first groove 202. The connection part 203b may be provided to incline with respect to the first groove 202, or may be provided to be curved, and any shape may be acceptable as long as it is connected to the first groove 202.

According to the semiconductor optical device 100 according to the embodiment, even if a misalignment in the connection part 203b occurs in a process of forming the connection part 203b, the first groove 202, the connection part 203b and the parallel part 203a are continuously formed, and the p-type semiconductor layer 303 can be more reliably divided.

In the semiconductor optical device 100 according to the embodiment, the width w2 of the second groove 203 is wider than the width w1 of the first groove 202. By such a configuration, since it is easy to form the first groove 202 on the bottom surface of the ridge portion 201 having a relatively small area, it is possible to form the second groove 203 so as to reliably divide the p-type semiconductor layer 303 formed relatively thick.

In the semiconductor optical device 100 according to the embodiment, the optical functioning part 215 includes the mirror 207 that converts an advancing direction of the light emitted from the light emitting layer of the active layer 302, and the second groove 203 is formed to penetrate the mirror 207. The mirror 207 is formed by the end surface of the p-type semiconductor layer 303 and the n-type semiconductor layer 301 which are inclined, and the second groove 203 is formed to penetrate the end surface of the p-type semiconductor layer 303 and the n-type semiconductor layer 301 which are inclined. By such a configuration, since the p-type semiconductor layer 303 can be reliably divided by the second groove 203, it is possible to reduce the parasitic capacitance.

Figure 5:
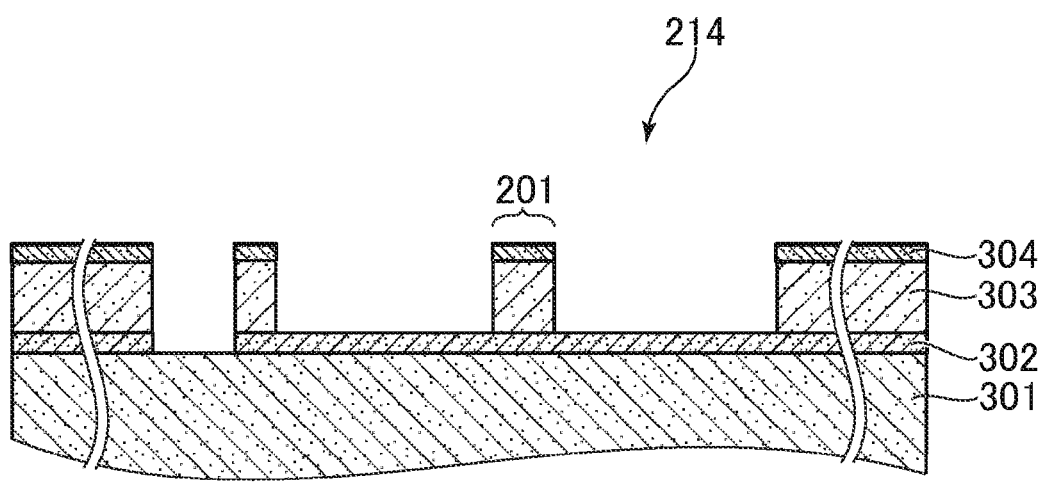
FIG. 5 is a diagram illustrating a first manufacturing process of the semiconductor optical device according to the first embodiment of the invention.

FIG. 5 is a diagram illustrating a first manufacturing process of the semiconductor optical device 100 according to the first embodiment of the invention. In the first manufacturing process, the first conductive type semiconductor layer (n-type semiconductor layer 301) is formed, the active layer 302 including the light emitting layer is formed on at least a part of the first conductive type semiconductor layer (n-type semiconductor layer 301), and the second conductive type semiconductor layer (p-type semiconductor layer 303) including the ridge portion 201 formed in the stripe shape is formed on the first conductive type semiconductor layer (n-type semiconductor layer 301) and the active layer 302. FIG. 5 illustrates a cross-section of the laser part 214 at a time when the first manufacturing process is completed. By performing the first manufacturing process, the active layer 302 is exposed on the bottom surfaces of the both sides of the ridge portion 201 and the n-type semiconductor layer 301 is exposed at a position separated from the ridge portion 201. The semiconductor optical device 100 may include an etching stop layer on the active layer 302 and the ridge portion 201 may be formed by performing wet etching on the p-type semiconductor layer 303 until the etching stop layer. In addition, by performing the wet etching on the p-type semiconductor layer 303 and the active layer 302, the n-type semiconductor layer 301 may be exposed.

Figure 6:
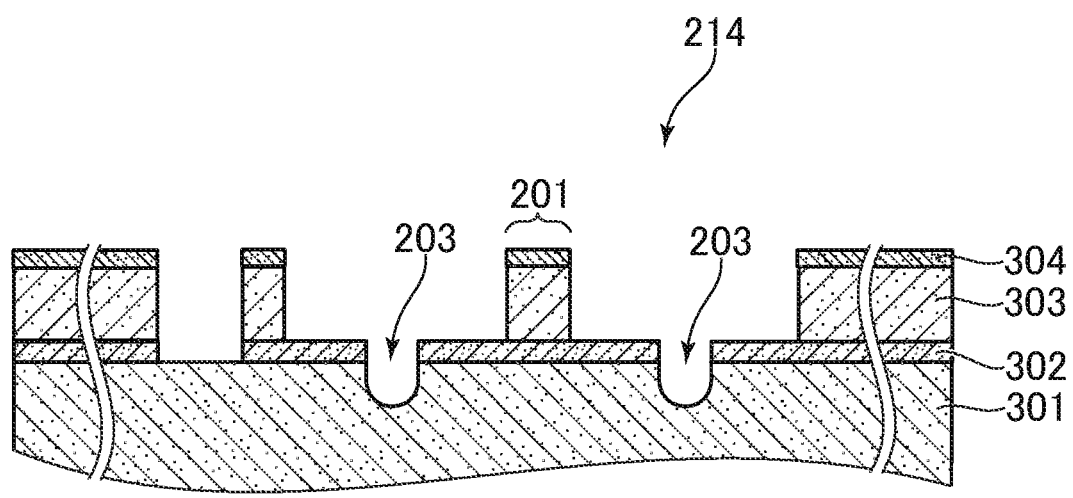
FIG. 6 is a diagram illustrating a second manufacturing process of the semiconductor optical device according to the first embodiment of the invention.

FIG. 6 is a diagram illustrating a second manufacturing process of the semiconductor optical device 100 according to the first embodiment of the invention. FIG. 6 illustrates a cross-section of the laser part 214 at a time when the second manufacturing process is completed. In the second manufacturing process, the pair of the first groove 202 dividing the active layer 302 is formed on the bottom surfaces of the both sides of the ridge portion 201. The first groove 202 may be formed with a depth reaching the n-type semiconductor layer 301 by the wet etching.

Figure 7:
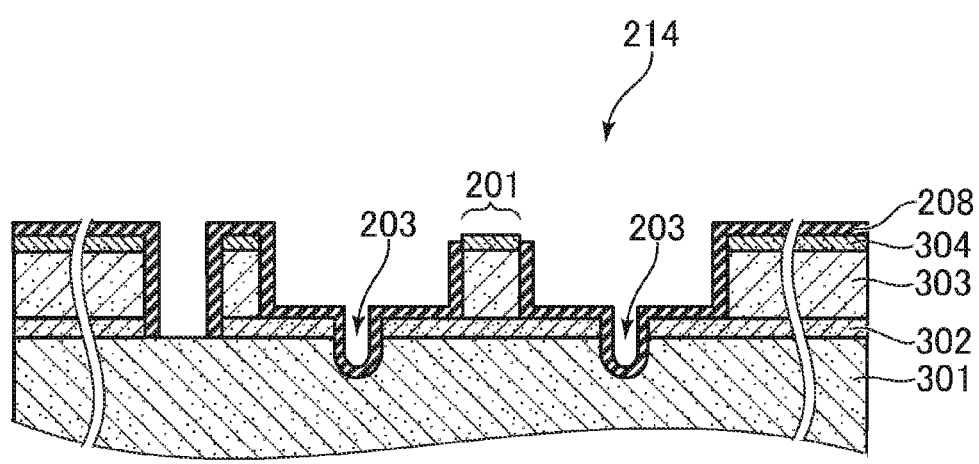
FIG. 7 is a diagram illustrating a third manufacturing process of the semiconductor optical device according to the first embodiment of the invention.

FIG. 7 is a diagram illustrating a third manufacturing process of the semiconductor optical device 100 according to the first embodiment of the invention. FIG. 7 illustrates a cross-section of the laser part 214 at a time when the third manufacturing process is completed. In the third manufacturing process, the protective film 208 ($SiO_2$ film) is formed on the entire surface of the element, and the top of the ridge portion 201 and the n-type semiconductor layer 301 are exposed by removing the protective film 208 formed on the top of the ridge portion 201 and a contact portion of the n-type electrode 206 and the n-type semiconductor layer 301 through etching. Through the third manufacturing process, the protective film 208 is formed on the inner wall surface of the first groove 202.

Figure 8:
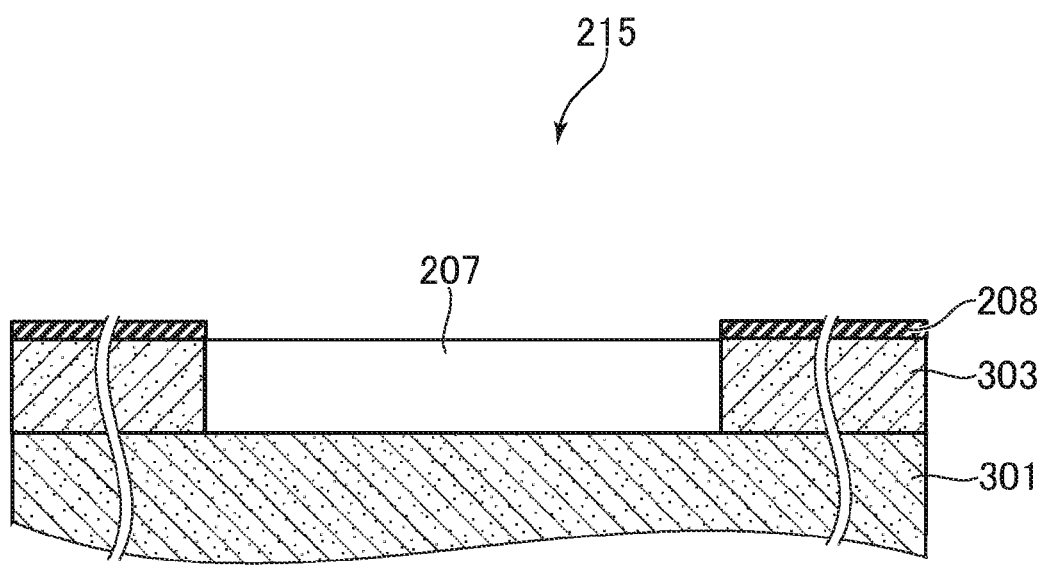
FIG. 8 is a diagram illustrating a fourth manufacturing process of the semiconductor optical device according to the first embodiment of the invention.

FIG. 8 is a diagram illustrating a fourth manufacturing process of the semiconductor optical device 100 according to the first embodiment of the invention. FIG. 8 illustrates a cross-section of the optical functioning part 215 at a time when the fourth manufacturing process is completed. In the fourth manufacturing process, the optical functioning part 215, is formed, which includes at least the first conductive type semiconductor layer (n-type semiconductor layer 301) and the second conductive type semiconductor layer (p-type semiconductor layer 303), converts a state of light emitted from the light emitting layer of the active layer 302 and has a height higher than the bottom surface of the ridge portion 201. More specifically, in the fourth manufacturing process, the mirror 207 is formed by performing the etching on the p-type semiconductor layer 303 and the n-type semiconductor layer 301 with an inclination angle of 45°. The etching may use chemically assisted ion beam etching (CAIBE) using chlorine and argon gas, may use reactive ion beam etching (RIBE) of chlorine-based gas, or may use wet etching.

Figure 9:
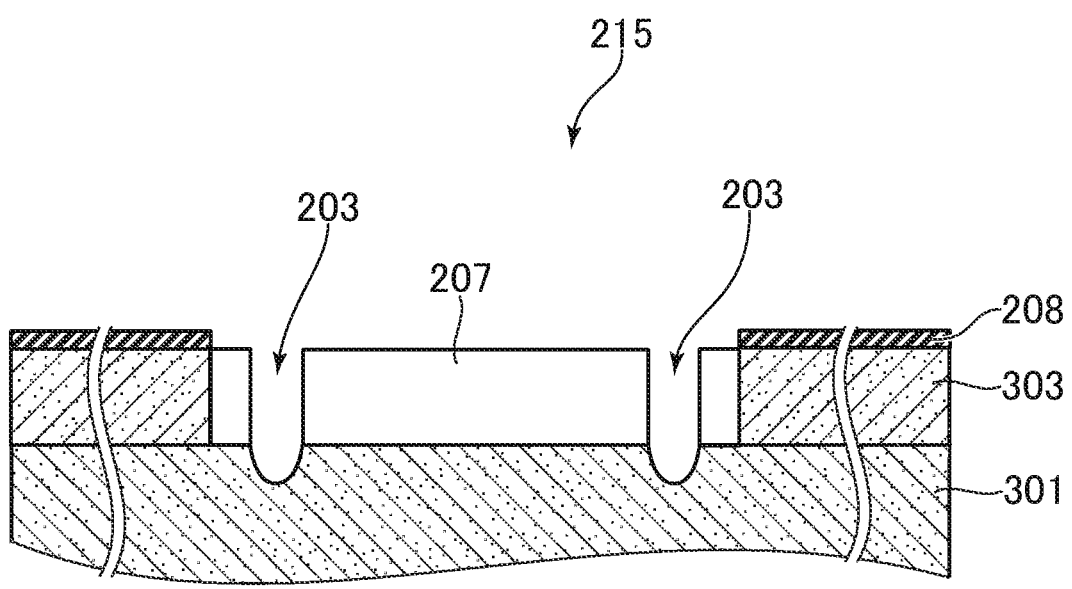
FIG. 9 is a diagram illustrating a fifth manufacturing process of the semiconductor optical device according to the first embodiment of the invention.

FIG. 9 is a diagram illustrating a fifth manufacturing process of the semiconductor optical device 100 according to the first embodiment of the invention. FIG. 9 illustrates a cross-section of the optical functioning part 215 at a time when the fifth manufacturing process is completed. In the fifth manufacturing process, the second groove 203, is formed, in which an end portion thereof is connected to the first groove 202 and divides the second conductive type semiconductor layer (p-type semiconductor layer 303) and the maximum height of the inner wall surface thereof is higher than the maximum height of the inner wall surface of the first groove 202 so as to form at least a part thereof on the optical functioning part 215. The second groove 203 may be formed with a depth reaching the n-type semiconductor layer 301 by the wet etching.

According to a manufacturing method of the semiconductor optical device 100 according to the embodiment, after performing a forming process of the first groove 202, a process for forming the second groove 203 on the optical functioning part 215 is performed. That is, since a process for forming the first groove 202 and a process for forming the second groove 203 are different from each other and the grooves having different depths are not formed at the same time, the respective steps can be easily performed. In addition, after forming the first groove 202, since the second groove 203 is formed so as to be connected to the first groove 202, the probability that the first groove 202 and the second groove 203 are continuously formed increases, and the manufacturing yield is improved.

Figure 10:
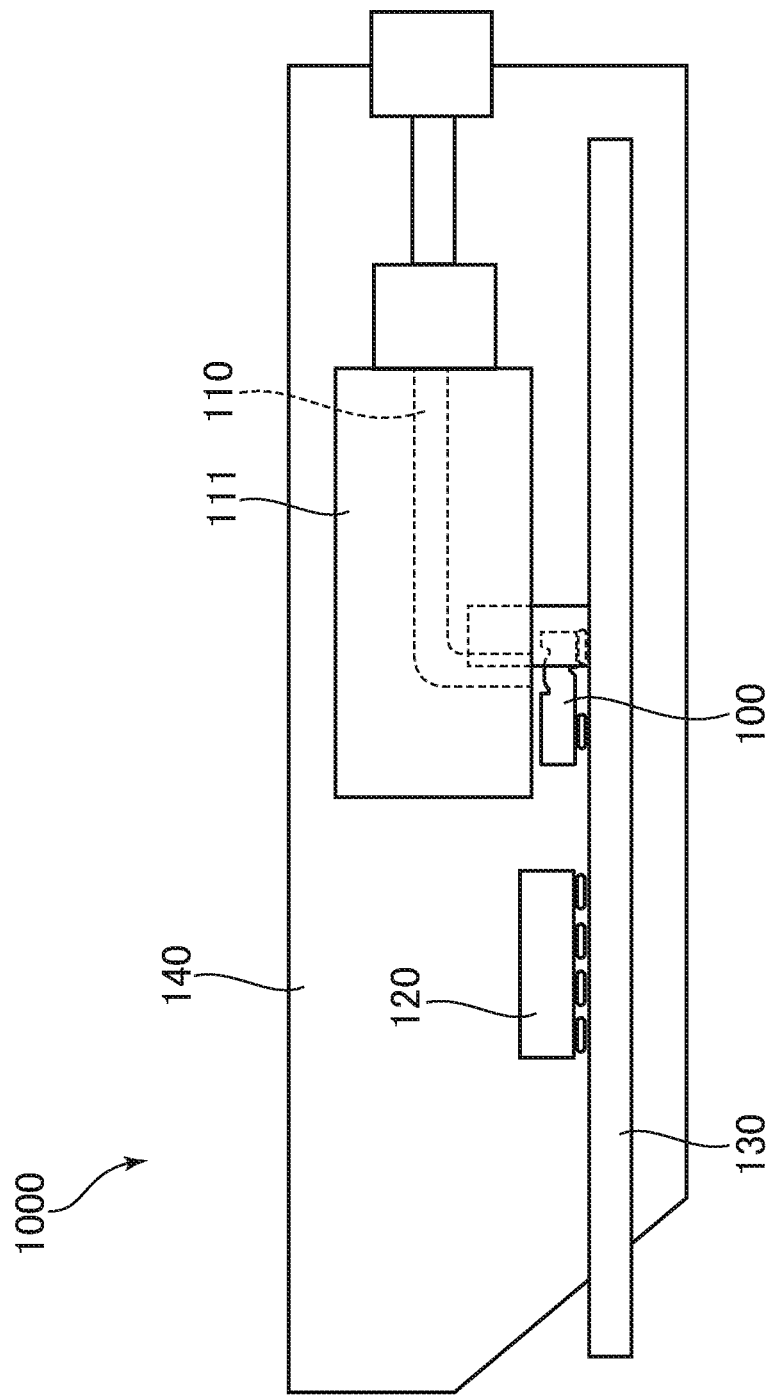
FIG. 10 is a side view of an optical module including the semiconductor optical device according to the first embodiment of the invention.
Figure 11:
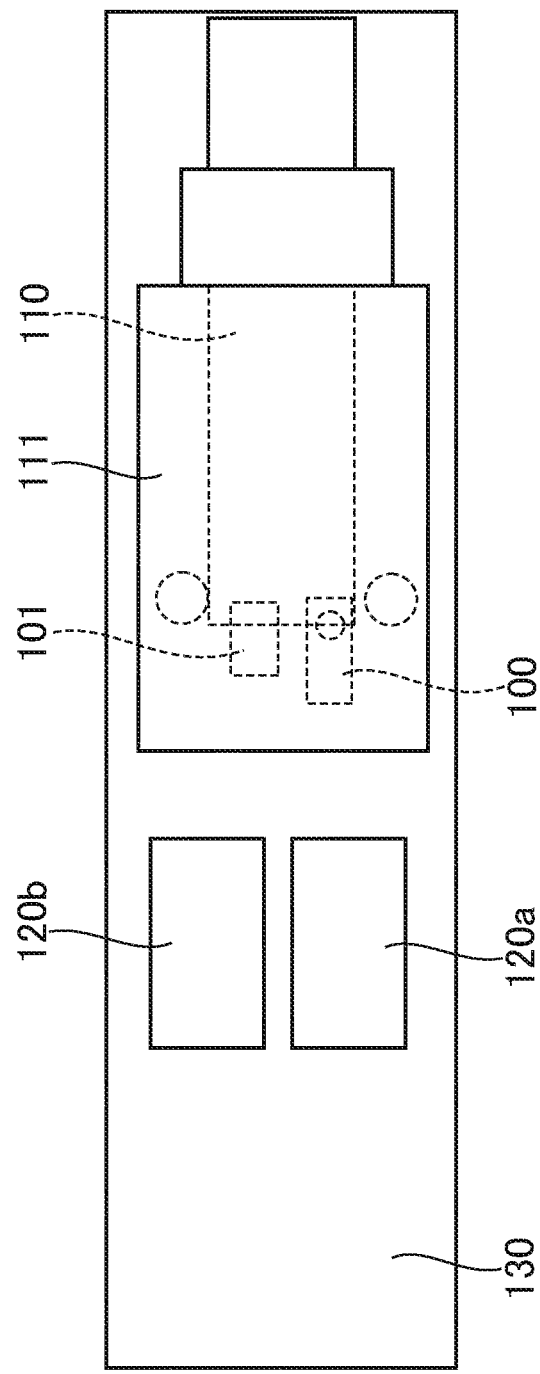
FIG. 11 is a top view of the optical module including the semiconductor optical device according to the first embodiment of the invention.

FIG. 10 is a side view of an optical module 1000 including the semiconductor optical device 100 according to the first embodiment of the invention. In addition, FIG. 11 is a top view of the optical module 1000 including the semiconductor optical device 100 according to the first embodiment of the invention. The optical module 1000 includes: the semiconductor optical device 100; a housing 140 that encloses the semiconductor optical device 100; and a transmission path (optical fiber 110) that is provided in the housing 140 and transmits light emitted from the semiconductor optical device 100 to the outside of the housing 140. The optical fiber 110 that is the transmission path is enclosed in a fiber connector 111. The optical module 1000 further includes: the drive circuit 120 that drives the semiconductor optical device 100; and a circuit board 130 to which the semiconductor optical device 100 and the drive circuit 120 are fixed.

The circuit board 130 is a printed circuit board (PCB). An integrated circuit for transmitter part 120a, An integrated circuit for receiver part 120b, the semiconductor optical device 100, and a light receiving element 101 are fixed on the circuit board 130. The integrated circuit for transmitter part 120a is the drive circuit 120 that drives the semiconductor optical device 100. The integrated circuit for recover part 120b is the drive circuit 120 that drives the light receiving element 101. The optical fiber 110 is an array fiber in which fibers corresponding to the number of optical signals output from the semiconductor optical device 100 and the number of optical signals received by the light receiving element 101 are bundled in parallel. The optical fiber 110 transmits the optical signal output from the semiconductor optical device 100 to an external device, and transmits the optical signal input from the external device to the light receiving element 101.

The optical module 1000 may have only a transmission function for the optical signal, or may be a multi-channel optical module having a plurality of laser elements and a plurality of light receiving elements. In addition, the optical module 1000 may be a subassembly such as a transmitter optical subassembly (TOSA) in which the transmission function alone is enclosed in a housing. In this case, the drive circuit 120 may not be disposed in the housing 140. In addition, although an example in which the optical fiber 110 is used for transmitting the optical signal is described, the invention is not limited thereto, and an optical system such as a lens may be used.

[Second Embodiment]

Figure 12:
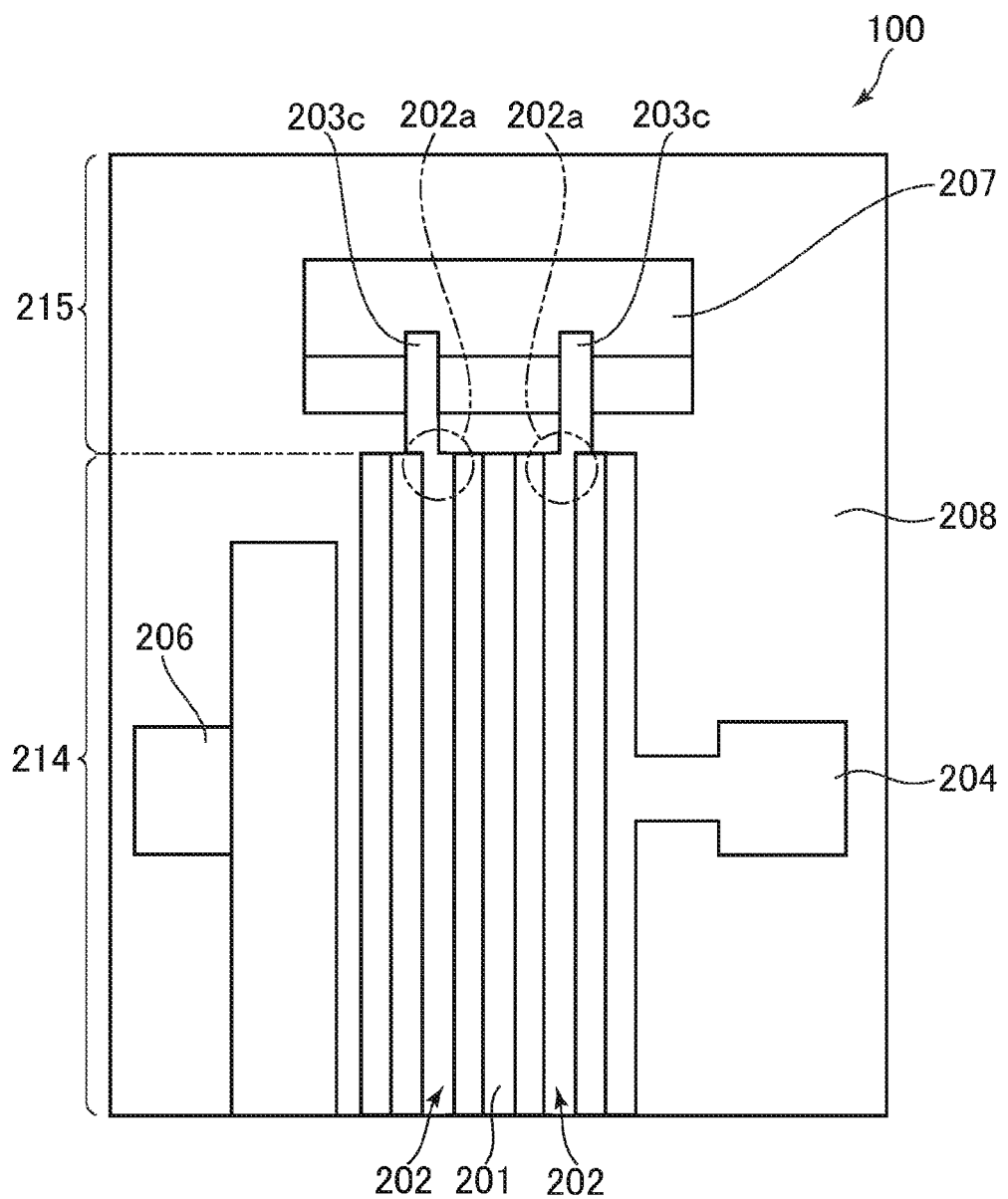
FIG. 12 is a top view of a semiconductor optical device according to a second embodiment of the invention.

FIG. 12 is a top view of the semiconductor optical device 100 according to a second embodiment of the invention. A second groove (parallel connection part 203c) of the semiconductor optical device 100 according to the embodiment is connected to the first groove 202 so as to overlap a part of an end portion of the second groove with the end portion 202a of the optical functioning part side of the first groove 202. With respect to other configurations, the semiconductor optical device 100 according to the embodiment has the same configuration as that of the first embodiment. That is, the parallel connection part 203c divides the second conductive type semiconductor layer 303, and the maximum height of the inner wall surface of the parallel connection part 203c is higher than the maximum height of the inner wall surface of the first groove 202.

The parallel connection part 203c extends in the same direction as that of the extending direction of the first groove 202, and is formed to penetrate the mirror 207. A pair of the parallel connection parts 203c is formed, and an interval therebetween is wider than an interval between the pair of first grooves 202.

In the semiconductor optical device 100 according to the embodiment, the end portion 202a of the optical functioning part side of the first groove 202 is formed to connect an external side of the end portion 202a of the optical functioning part side to the parallel connection part 203c of the second groove. By such a configuration, even if a misalignment in the parallel connection part 203c occurs in a process of forming the parallel connection part 203c, the parallel connection part 203c and the first groove 202 are continuously formed, it is possible to reduce the parasitic capacitance by more reliably dividing the p-type semiconductor layer 303. In addition, the possibility that the laser light emitted from an end surface of the active layer 302 interferes with the parallel connection part 203c, is reduced.

[Third Embodiment]

Figure 13:
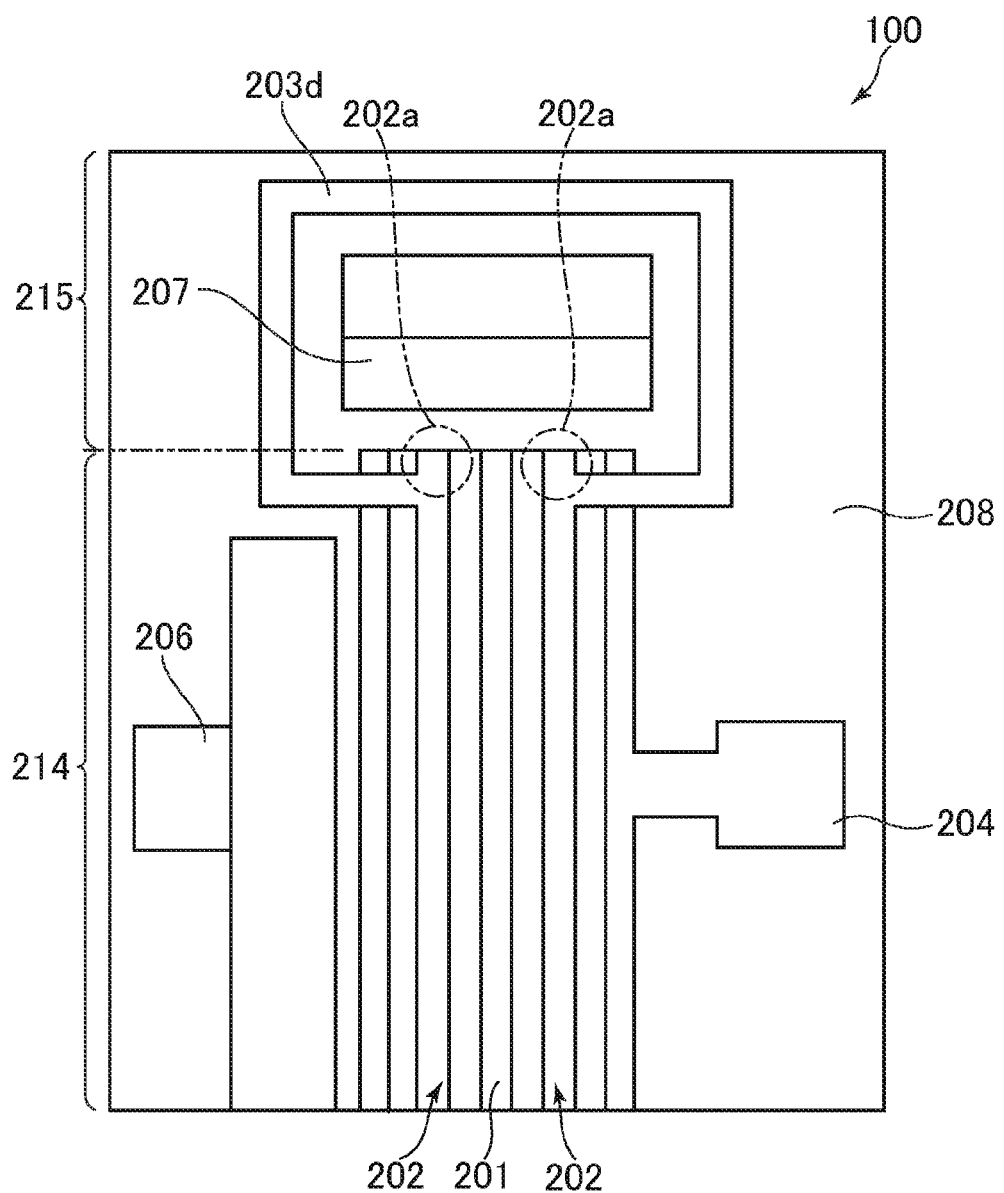
FIG. 13 is a top view of a semiconductor optical device according to a third embodiment of the invention.

FIG. 13 is a top view of the semiconductor optical device 100 according to a third embodiment of the invention. The optical functioning part 215 of the semiconductor optical device 100 according to the embodiment includes the mirror 207 that converts an advancing direction of the light emitted from the light emitting layer of the active layer 302, and the second groove (surrounding portion 203d) is formed to surround the mirror 207 in a plan view. With respect to other configurations, the semiconductor optical device 100 according to the embodiment has the same configuration as that of the first embodiment. That is, the surrounding portion 203d divides the second conductive type semiconductor layer 303, and the maximum height of the inner wall surface of the surrounding portion 203d is higher than the maximum height of the inner wall surface of the first groove 202.

In the semiconductor optical device 100 according to the embodiment, the end portion 202a of the optical functioning part side of the first groove 202 is formed to protrude to the optical functioning part 215 side by approximately 5 μm. The surrounding portion 203d is connected to the first groove 202 in a direction orthogonal to the extending direction of the first groove 202. The surrounding portion 203d is formed with a depth reaching the n-type semiconductor layer 301 so as to surround the mirror 207 in a plan view. By such a configuration, even if the mirror 207 is formed to be relatively small, it is possible to continuously form the surrounding portion 203d and the first groove 202, and it is possible to reduce the parasitic capacitance by more reliably dividing the p-type semiconductor layer 303.

[Fourth Embodiment]

Figure 14:
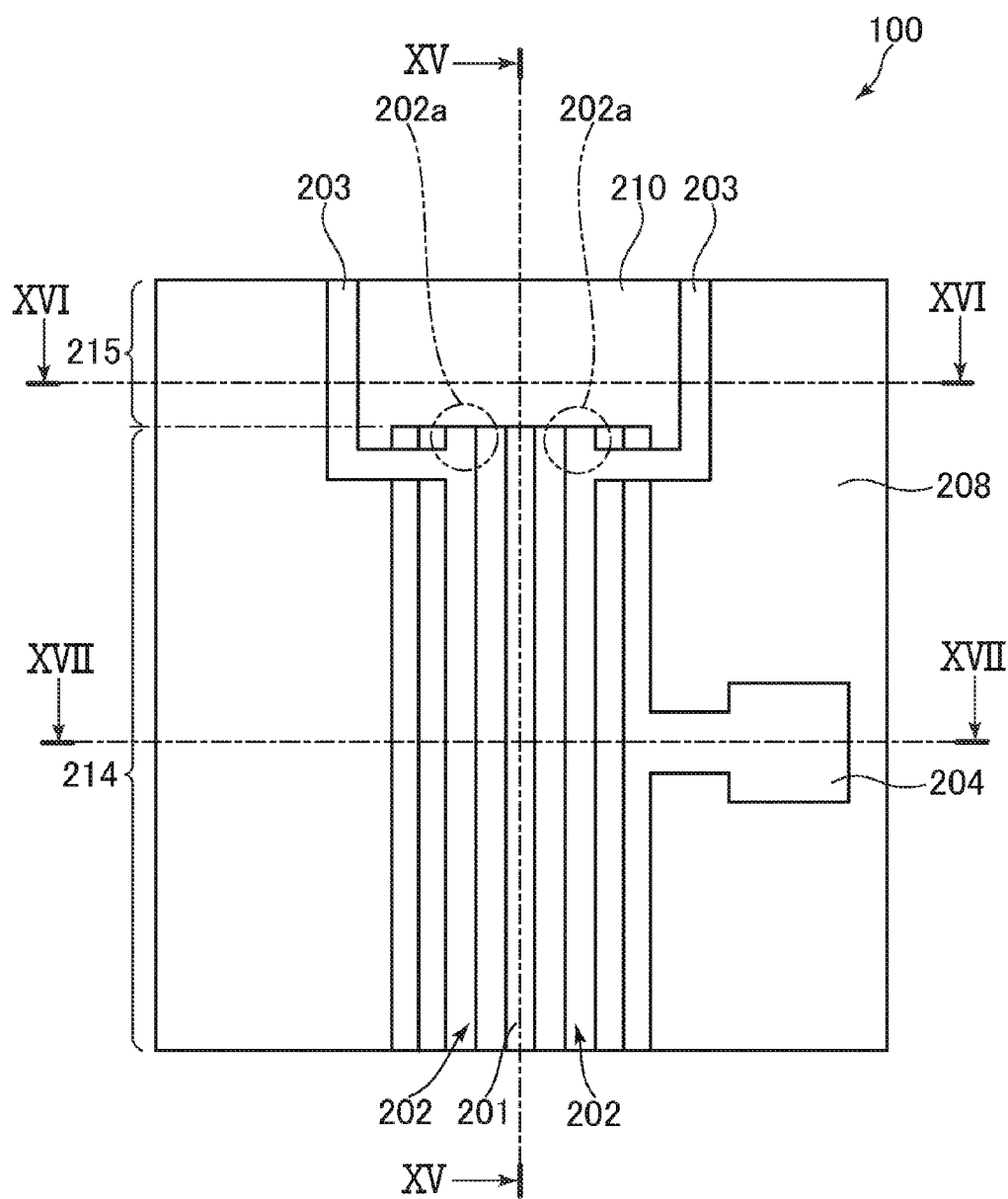
FIG. 14 is a top view of a semiconductor optical device according to a fourth embodiment of the invention.
Figure 15:
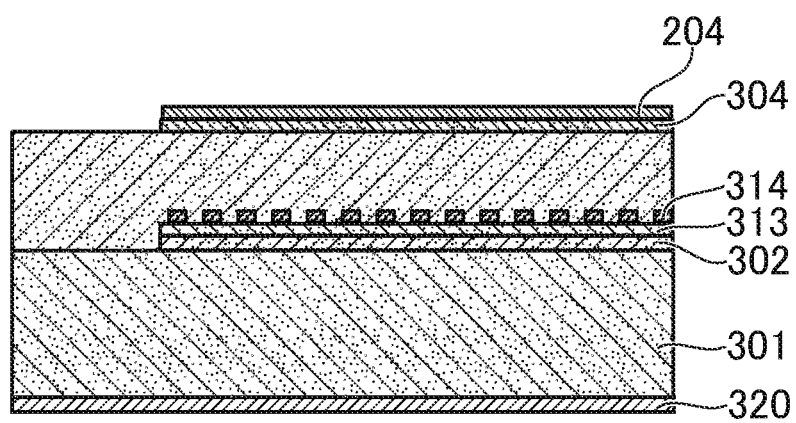
FIG. 15 is a sectional view of the semiconductor optical device according to the fourth embodiment of the invention.
Figure 16:
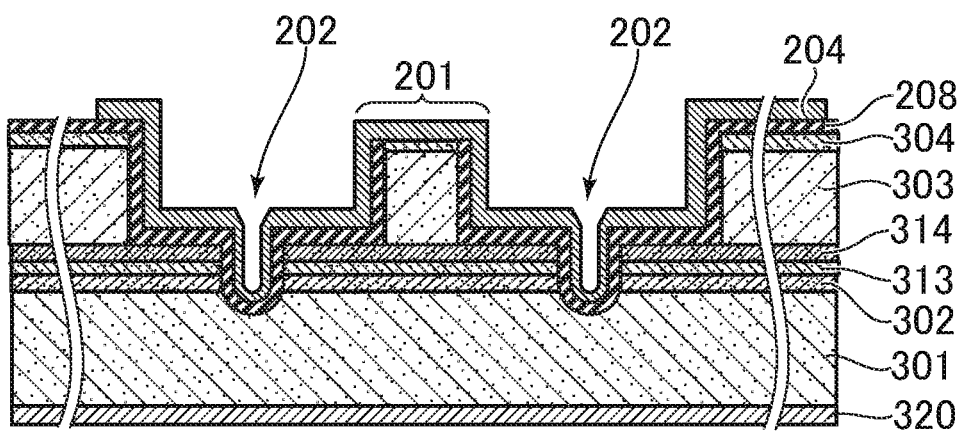
FIG. 16 is a sectional view of the semiconductor optical device according to the fourth embodiment of the invention.
Figure 17:
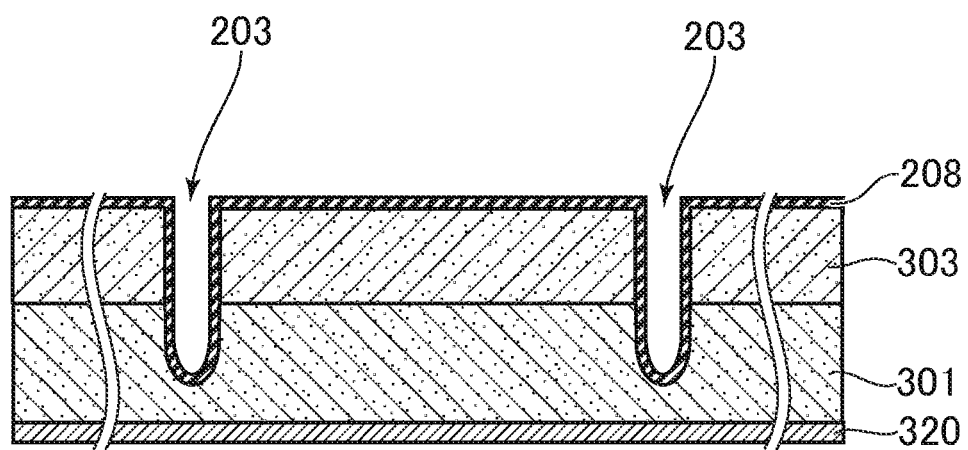
FIG. 17 is a sectional view of the semiconductor optical device according to the fourth embodiment of the invention.

FIG. 14 is a top view of the semiconductor optical device 100 according to a fourth embodiment of the invention. In addition, FIG. 15, FIG. 16, and FIG. 17 are sectional views of the semiconductor optical device 100 according to the fourth embodiment of the invention. FIG. 15 is a diagram illustrating a cross-section taken along the line XV-XV in FIG. 14, FIG. 16 is a diagram illustrating a cross-section taken along the line XVI-XVI in FIG. 14, and FIG. 17 is a diagram illustrating a cross-section taken along the line XVII-XVII in FIG. 14. The optical functioning part 215 of the semiconductor optical device 100 according to the embodiment includes a window portion 210 and the second groove 203 is formed to reach an end surface of the window portion 210 by penetrating the window portion 210. The window portion 210 is formed by the p-type semiconductor layer 303 provided on the n-type semiconductor layer 301, prevents end surface destruction of the semiconductor optical device 100, and reduces a rate at which returned light is coupled to a laser waveguide. In addition, the semiconductor optical device 100 according to the embodiment includes a rear surface n-type electrode 320. With respect to other configurations, the semiconductor optical device 100 according to the embodiment has the same configuration as that of the semiconductor optical device according to the first embodiment. That is, the second groove 203 divides the second conductive type semiconductor layer 303, and the maximum height of the inner wall surface of the second groove 203 is higher than the maximum height of the inner wall surface of the first groove 202.

In the semiconductor optical device 100 according to the embodiment, the end portion 202a of the optical functioning part side of the first groove 202 is formed to protrude to the optical functioning part 215 side by approximately 5 µm. The second groove 203 is connected to the first groove 202 in the direction orthogonal to the extending direction of the first groove 202. By such a configuration, even in a case of the semiconductor optical device 100 in which the window portions 210 are integrated, it is possible to continuously form the second groove 203 and the first groove 202, and it is possible to reduce the parasitic capacitance by reliably dividing the p-type semiconductor layer 303 while preventing the end surface destruction of the element and improving return light tolerance.

[Fifth Embodiment]

Figure 18:
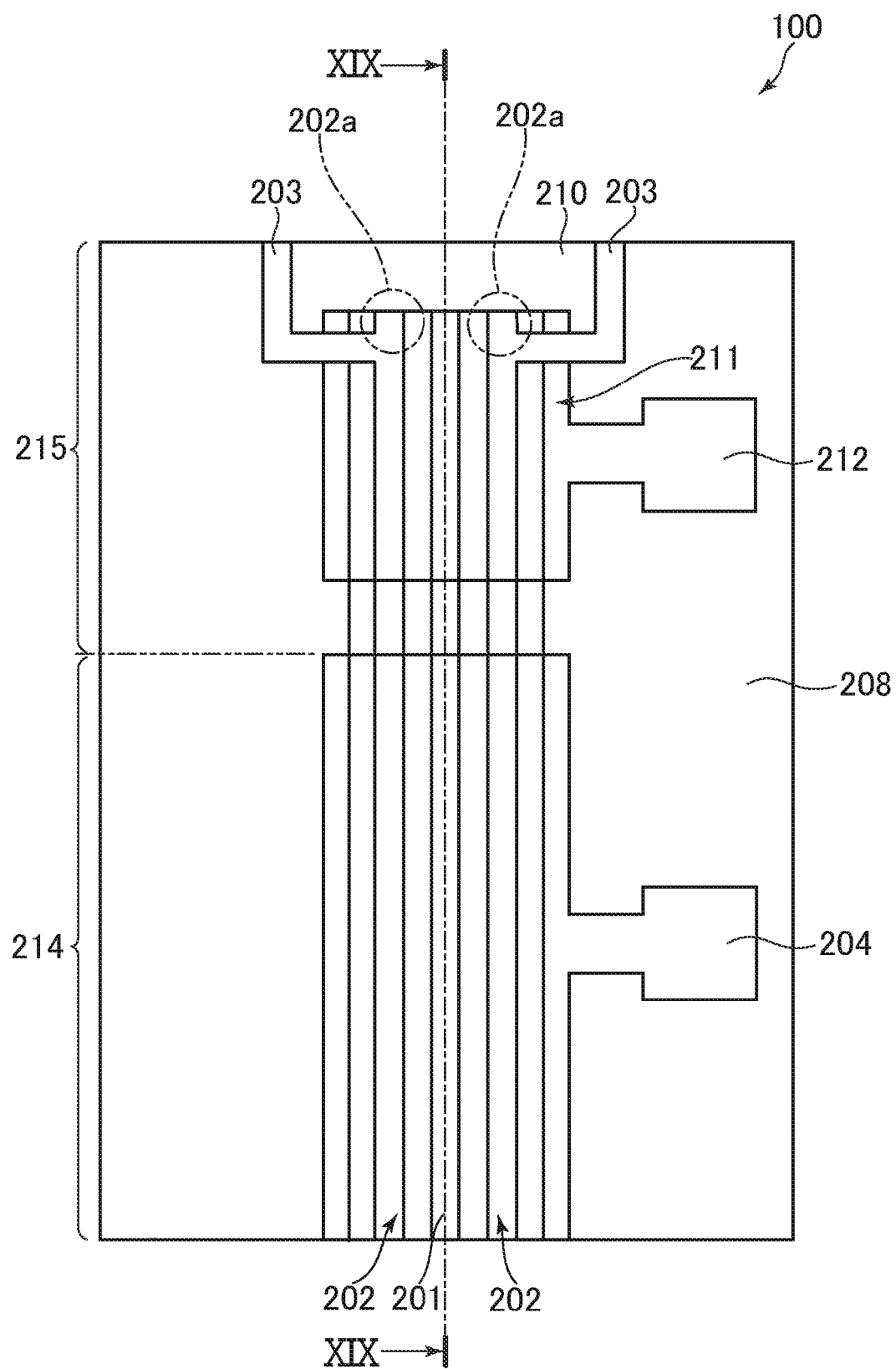
FIG. 18 is a top view of a semiconductor optical device according to a fifth embodiment of the invention.
Figure 19:
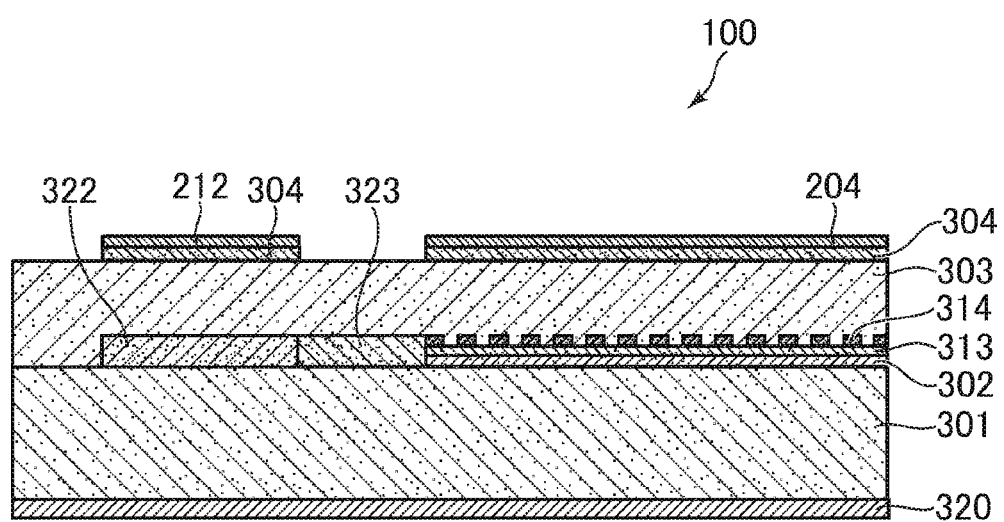
FIG. 19 is a sectional view of the semiconductor optical device according to the fifth embodiment of the invention.

FIG. 18 is a top view of the semiconductor optical device 100 according to a fifth embodiment of the invention. In addition, FIG. 19 is a sectional view of the semiconductor optical device 100 according to the fifth embodiment of the invention. FIG. 19 is a diagram illustrating a cross-section taken along line XIX-XIX of FIG. 18. The optical functioning part 215 of the semiconductor optical device 100 according to the embodiment includes an optical modulator 211 that modulates amplitude of the light emitted from the light emitting layer of the active layer 302 by a light absorption layer 322 provided on the first conductive type semiconductor layer (n-type semiconductor layer 301), and the first groove 202 is formed to divide the active layer 302 and the light absorption layer 322. The optical modulator 211 is provided between the window portion 210 and the light emitting layer. Similar to the semiconductor optical device according to the fourth embodiment, the second groove 203 which penetrates the window portion 210 so as to reach the end surface of the window portion 210 is formed on the window portion 210 provided in front of the optical modulator 211. The optical modulator 211 is an electric field absorption type optical modulator, and includes the light absorption layer 322 formed on then-type semiconductor layer 301, the p-type semiconductor layer 303 formed on the light absorption layer 322, the p-type contact layer 304 formed on the p-type semiconductor layer 303, and an optical modulator electrode 212 formed on the p-type contact layer 304. A waveguide layer 323 is connected to a portion between the active layer 302 of the laser part 214 and the light absorption layer 322 of the optical modulator 211. In addition, the semiconductor optical device 100 according to the embodiment includes the rear surface n-type electrode 320. The rear surface n-type electrode 320 is a common electrode of the laser part 214 and the optical functioning part 215 (optical modulator 211). In the semiconductor optical device 100 according to the embodiment, the ridge portion 201 is formed over the laser part 214 and the optical functioning part 215, and also formed above the light absorption layer 322. In addition, the first groove 202 is formed over the laser part 214 and the optical functioning part 215 in parallel with the ridge portion 201, and divides the active layer 302 and the light absorption layer 322. With respect to other configurations, the semiconductor optical device 100 according to the embodiment has the same configuration as that of the first embodiment. That is, the second groove 203 divides the second conductive type semiconductor layer 303, and the maximum height of the inner wall surface of the second groove 203 is higher than the maximum height of the inner wall surface of the first groove 202.

In the semiconductor optical device 100 according to the embodiment, the end portion 202a of the optical functioning part side of the first groove 202 is formed to protrude to an end surface side of the optical functioning part 215 by approximately 5 µm. The second groove 203 is connected to the first groove 202 in the direction orthogonal to the extending direction of the first groove 202. By such a configuration, even in a case of the semiconductor optical device 100 in which the optical modulator 211 is integrated, it is possible to continuously form the second groove 203 and the first groove 202, and it is possible to reduce the parasitic capacitance by reliably dividing the p-type semiconductor layer 303.

In the embodiments described above, the mirror 207, the window portion 210, and the like are described as the optical functioning part 215. However, the optical functioning part 215 is not limited thereto. The gist of the invention is that the depths of separated grooves (first groove 202 and second groove 203) of each portion are different from each other in the semiconductor optical device 100 having the optical functioning part 215 optically connected to the light emitting layer. The optical functioning part 215 may be any type. It is needless to say that an effect of the invention can be obtained even though, for example, the optical functioning part 215 is the optical modulator.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A semiconductor optical device comprising:
a first conductive type semiconductor layer;
an active layer provided on at least a part of the first conductive type semiconductor layer and comprising a light emitting layer;
a second conductive type semiconductor layer comprising a ridge portion provided on the first conductive type semiconductor layer and the active layer and formed in a stripe shape;
a pair of first grooves formed on bottom surfaces of both sides of the ridge portion and dividing the active layer;
an optical functioning part comprising at least the first conductive type semiconductor layer and the second conductive type semiconductor layer and configured to convert a state of light emitted from the light emitting layer, and the optical functioning part has a height higher than a height of the bottom surfaces of the ridge portion; and
a pair of second grooves respectively formed in connection with an outer side of a corresponding one of the first grooves and in a state of being separated from both end portions of the pair of first grooves, and at least a part of each of the pair of second grooves is formed on the optical functioning part,
wherein the second conductive type semiconductor layer is divided by the pair of second grooves and a maximum height of an inner wall surface of each of the second grooves is higher than a maximum height of an inner wall surface of the corresponding one of the first grooves.

2. The semiconductor optical device according to claim 1, wherein each of the second grooves comprises:
a parallel part that extends in the same direction as an extending direction of the corresponding one of the first grooves, and
a connection part that extends in a direction different from the extending direction of the corresponding one of the first grooves, the connection part being connected to the corresponding one of the first grooves in a state of being separated from the end portion of the optical functioning part side of the corresponding one of the first grooves.

3. The semiconductor optical device according to claim 1, wherein a width of each of the pair of second grooves is wider than a width of the corresponding one of the first grooves.

4. The semiconductor optical device according to claim 1, wherein the optical functioning part comprises a mirror that converts an advancing direction of the light emitted from the light emitting layer, and
each of the pair of second grooves is formed to penetrate the mirror.

5. The semiconductor optical device according to claim 1, wherein the optical functioning part comprises a mirror that converts an advancing direction of the light emitted from the light emitting layer, and
the pair of second grooves are formed to be connected to each other to surround the mirror in a plan view.

6. The semiconductor optical device according to claim 1, wherein the optical functioning part comprises an optical modulator that modulates an amplitude of the light emitted from the light emitting layer by a light absorption layer formed on the first conductive type semiconductor layer, and
each of the pair of first grooves is formed to divide the active layer and the light absorption layer.

7. The semiconductor optical device according to claim 1, wherein the optical functioning part comprises a window portion, and
each of the pair of second grooves is formed to reach an end surface of the window portion by penetrating the window portion.

8. The semiconductor optical device according to claim 7, wherein the optical functioning part further comprises an optical modulator that is provided between the window portion and the light emitting layer and modulates an amplitude of the light emitted from the light emitting layer.

9. An optical module comprising:
the semiconductor optical device according to claim 1;
a housing that encloses the semiconductor optical device; and
a transmission path that is provided in the housing, and transmits the light emitted from the semiconductor optical device to the outside of the housing.

10. The optical module according to claim 9, further comprising:
a drive circuit that drives the semiconductor optical device; and
a circuit board on which the semiconductor optical device and the drive circuit are fixed.

11. A semiconductor optical device comprising:
a first conductive type semiconductor layer;
an active layer provided on at least a part of the first conductive type semiconductor layer, and comprising a light emitting layer;
a second conductive type semiconductor layer comprising a ridge portion provided on the first conductive type semiconductor layer and the active layer and formed in a stripe shape;
a pair of first grooves, formed on bottom surfaces of both sides of the ridge portion and dividing the active layer;
an optical functioning part comprising at least the first conductive type semiconductor layer and the second conductive type semiconductor layer, and configured to convert a state of light emitted from the light emitting layer, and the optical functioning part has a height higher than a height of a bottom surface of the ridge portion; and
a pair of second grooves respectively formed in connection, at the optical functioning part side of the first grooves, with an outer part of an end portion of a corresponding one of the first grooves and apart from an inner part of the end portion of the corresponding one of the first grooves.

12. A method for manufacturing semiconductor optical device, the method comprising:
forming a first conductive type semiconductor layer;
forming an active layer including a light emitting layer on at least a part of the first conductive type semiconductor layer;
forming a second conductive type semiconductor layer including a ridge portion formed in a stripe shape on the first conductive type semiconductor layer and the active layer;
forming a pair of first grooves dividing the active layer on bottom surfaces of both sides of the ridge portion;
forming an optical functioning part comprising at least the first conductive type semiconductor layer and the second conductive type semiconductor layer, and configured to convert a state of light emitted from the light emitting layer, and the optical functioning part has a height higher than a height of the bottom surfaces of the ridge portion; and forming a pair of second grooves in respective connection with an outer side of a corresponding one of the first grooves and in a state of being separated from both end portions of the pair of first grooves, and at least a part of each of the second grooves is formed on the optical functioning part, wherein the second conductive type semiconductor layer is divided by the second grooves, and a maximum height of an inner wall surface of each of the second grooves is higher than a maximum height of an inner wall surface of the corresponding one of the first grooves.

* * * * *